United States Patent [19]

Cogan et al.

[11] Patent Number: 4,845,051
[45] Date of Patent: Jul. 4, 1989

[54] BURIED GATE JFET

[75] Inventors: Adrian I. Cogan, San Jose; Richard A. Blanchard, Los Altos, both of Calif.

[73] Assignee: Siliconix incorporated, Santa Clara, Calif.

[21] Appl. No.: 115,076

[22] Filed: Oct. 29, 1987

[51] Int. Cl.$^4$ .............. H01L 21/44; H01L 21/48
[52] U.S. Cl. ......................... 437/203; 437/38; 437/78; 437/79; 437/228
[58] Field of Search ............ 437/203, 29, 59, 78, 437/160; 156/643; 357/22

[56] References Cited

U.S. PATENT DOCUMENTS

| 4,375,124 | 3/1983 | Cogan | 29/571 |
| 4,417,385 | 11/1983 | Temple | 29/571 |
| 4,466,176 | 8/1984 | Temple | 29/571 |
| 4,476,622 | 10/1984 | Cogan | 29/571 |
| 4,520,552 | 6/1985 | Arnould et al. | 437/203 |
| 4,543,706 | 10/1985 | Bencuya et al. | 29/571 |
| 4,566,172 | 1/1986 | Bencuya et al. | 29/571 |
| 4,587,712 | 5/1986 | Baliga | 29/571 |
| 4,689,871 | 9/1987 | Malhi | 437/203 |
| 4,745,081 | 5/1988 | Beyer et al. | 437/203 |

FOREIGN PATENT DOCUMENTS 0179571 8/1986 Japan .
1084937 9/1967 United Kingdom .

OTHER PUBLICATIONS

Ting, "Silicide for Contacts and Interconnects", International Electronics Device Meeting 1984, pp. 110–113.
Kim et al., "Mo/TiW Contact for VLSI Applications", International Electronic Device Meeting 1984, pp. 134–137.
Sachdev et al., "CVD Tungsten and Tungsten Silicide for VLSI Applications", Semiconductor International, May, 1985, pp. 306–310.

Primary Examiner—Brian E. Hearn
Assistant Examiner—Tom Thomas
Attorney, Agent, or Firm—Skjerven, Morrill, MacPherson, Franklin & Friel

[57] ABSTRACT

A process for manufacturing a JFET in accordance with our invention includes the steps of forming an N− layer (12) on an N+ substrate (10), and forming an N+ layer (14) on the N− layer. A plurality of trenches (19) are etched to extend through the N+ layer and through a portion of the N− layer. A layer of sidewall oxide (20) is grown along the vertical walls of the trenches. The trenches are then extended so that the sidewall oxide only covers a portion of the vertical walls of the trenches. A layer of P type polysilicon (22) is then deposited in the trenches and impurities are diffused from the P type polysilicon into a surrounding portion of the N− layer to thereby form a plurality of P type regions (23). The size of the depletion region between the P type regions and the N− layer is controlled by applying selected voltages to the P type polysilicon, thereby controlling the current through the resulting JFET.

13 Claims, 16 Drawing Sheets

BURIED GATE JFET

BACKGROUND OF THE INVENTION

This invention relates to junction field effect transistors and more specifically to junction field effect transistors having a subsurface gate structure.

Junction field effect transistors ("JFETs") are well known in the art. Examples of JFETs are discussed in U.S. Pat. No. 4,543,706, issued to Bencuya et al., and U.S. Pat. No. 4,476,622, issued to Cogan, each incorporated herein by reference. In the processes discussed in the '622 and '706 patents, an N− epitaxial layer 1 is grown on an N+ substrate 2 and an N+ region 3 is formed at the surface of N− epitaxial layer 1 (FIG. 1). N+ substrate 2 serves as the JFET drain, and N+ region 3 at the epitaxial layer surface serves as the source. Grooves 4 are etched into epitaxial layer 1, silicon dioxide layers 5 are grown on the vertical walls of grooves 4, and P type impurities are implanted and diffused into the semiconductor material at the bottom of grooves 4, thereby forming P type gate regions 6. A metal layer 7 is then deposited at the bottom of the grooves 4 to electrically contact P type gate regions 6. (In the '706 patent, grooves 4 are filled with a solid inert material so that the resulting structure has a planar surface.)

The size of the depletion regions 8 between P type gate regions 6 and N− epitaxial layer 1 is controlled by applying a selected voltage to gate regions 6 via metal layer 7, thereby controlling the amount of curent flowing between N+ region 3 and substrate 2.

A variation of the above-described vertical JFETs is discussed in U.S. Pat. No. 4,566,172, issued to Bencuya et al., in which the P type gate regions extend from the sides of the grooves but not beneath the grooves. This results in reduced gate capacitance.

Another variation of a process for forming a vertical JFET is discussed in U.S. Pat. No. 4,375,124, issued to Cogan, in which the P type gate region is formed by diffusing impurities from P doped polysilicon deposited in the grooves into the epitaxial layer. The '172 and '124 patents are incorporated herein by reference.

SUMMARY OF THE INVENTION

A new process for forming a vertical buried gate JFET in accordance with our invention begins with the step of providing a wafer including first region of semiconductor material of a first conductivity type and a first dopant concentration, a second region of semiconductor material of the first conductivity type and a second dopant concentration less than the first dopant concentration formed on the first region, and a third region of the first conductivity type and a third dopant concentration greater than the second dopant concentration formed on the second region. In one embodiment, the first, second and third regions are N+, N− and N+ silicon, respectively. The first region serves as a drain and the third region serves as a source of the to be formed JFET.

A first insulating layer is formed on the surface of the third region. A plurality of grooves are then etched through the first insulating layer, the third region and part of the second region, and a second insulating layer of a material such as silicon dioxide is formed on the groove walls. The grooves are then extended further into the second region, and semiconductor material of a second conductivity type (e.g., P+ polysilicon) is deposited in the grooves. In one embodiment, the polysilicon is only provided in a bottom portion of the grooves, and does not extend to the top of the grooves. Dopants are then diffused from the polysilicon into the surrounding portion of the second region to thereby form the JFET gate.

The top portion of the grooves are then filled with a third insulating layer such that the top surface of the third insulating layer is coplanar with the top surface of the third region. Portions of the first insulating layer are then removed to permit electrical contact to the source, and electrical contact holes are then formed in the third insulating layer to permit electrical contact to the gate via the P+ polysilicon. Metallization is deposited on the top of the transistor to contact to source and polysilicon. Metallization is also deposited on the bottom of the transistor to electrically contact the drain.

In an alternative embodiment, instead of forming the third insulating layer, the polysilicon extends to the top of the groove.

DETAILED DESCRIPTION

FIGS. 2a to 2j illustrate in cross section a portion of a semiconductor wafer during a JFET manufacturing process in accordance with our invention. FIGS. 2a to 2j illustrate only a small portion of the wafer, it being understood that identical structures are simultaneously formed elsewhere on the wafer which are also part of the JFET. Thus, FIGS. 2a to 2j illustrate only a small cell or region of a much larger JFET.

Figure 1:
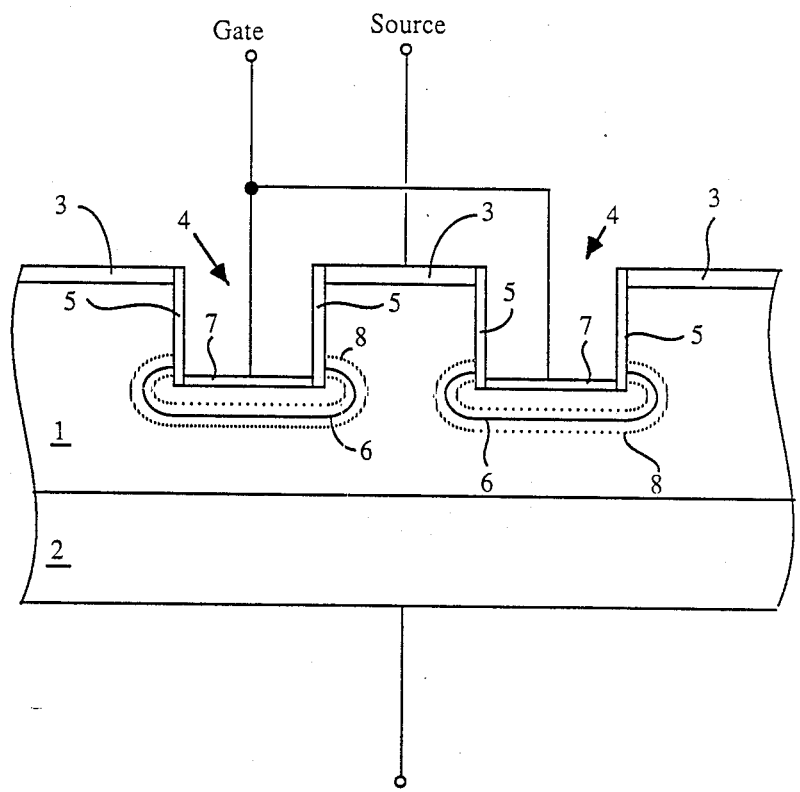
FIG. 1 illustrates in cross section a JFET constructed in accordance with the prior art.
Figure 2A:
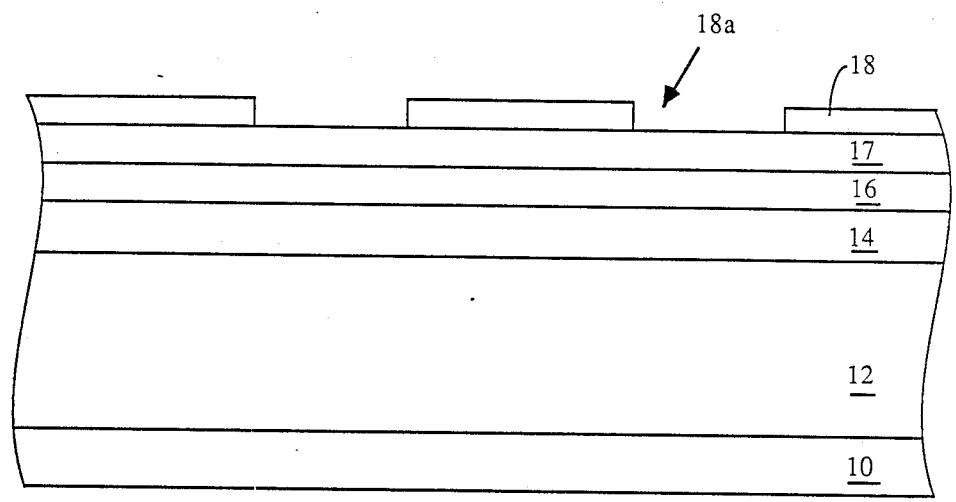
FIG. 2a to 2j illustrate in cross section a JFET transistor during a manufacturing process in accordance with a first embodiment of the present invention.

One embodiment of a process for manufacturing a transistor in accordance with our invention begins with the step of forming an N− region 12 and an N+ region 14 on an N+ region 10 (FIG. 2a). N+ region 10 is typically a silicon substrate having a [100]or other crystal orientation and a dopant concentration of about $10^{19}$/cc. N− region 12 is between 1 and 15 microns thick and has a dopant concentration between $10^{14}$ and $10^{17}$/cc, and N+ region 14 has a thickness of about 0.5 to 1.0 microns, and a dopant concentration of $10^{19}$ to $10^{20}$/cc. In one embodiment, N− region 12 and N+ region 14 are formed by epitaxial deposition. In another embodiment, N− region 12 is formed by epitaxial deposition and N+ region 14 is formed by implantation or diffusion of a suitable N type impurity into region 12. As will be discussed in greater detail below, N+ substrate 10 and N+ region 14 serve as the drain and source, respectively, of a subsequently formed N channel JFET. A thin SiO$_2$ layer 16 (typically 100 to 1500 nm thick) is thermally grown on the wafer, and a Si$_3$N$_4$ layer 17 is formed on SiO$_2$ layer 16. In one embodiment, layer 17 is formed by chemical vapor deposition, e.g. to a thickness of 50 to 400 nm. A photoresist layer 18 is then applied to the wafer in a conventional manner and lithographically patterned, thereby forming a window region 18a therein. As described in greater detail below, window region 18a defines the lateral extent of a subsequently etched trench.

Figure 2B:
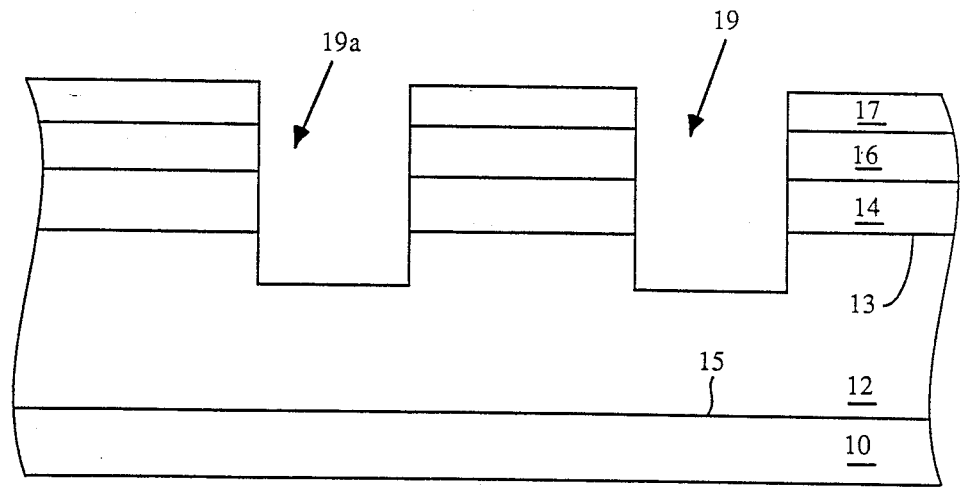

Thereafter, the portion of SiO$_2$ layer 16, Si$_3$N$_4$ layer 17, N+ region 14 and a portion of N− region 12 within window region 18a are removed, e.g. by a dry etching process (e.g., reactive ion etching, plasma etching, or ion milling), thereby forming a trench 19 having vertical sidewalls (FIG. 2b). In one embodiment, trench 19 is etched so as to extend to a depth of 0.2 to 5 $\mu$m below the border 13 between regions 12 and 14 and 0.5 to 5 $\mu$m above the border 15 between regions 10 and 12. As described in greater detail below, polysilicon is subsequently formed in trench 19. Thereafter, photoresist layer 18 is removed. (As can be seen in FIG. 2b, a second trench 19a is concurrently formed adjacent to trench 19. The present description refers only to trench 19 and the structures formed therein, but as illustrated in FIGS. 2a to 2j, identical structures are concurrently formed in trench 19a.)

Figure 2C:
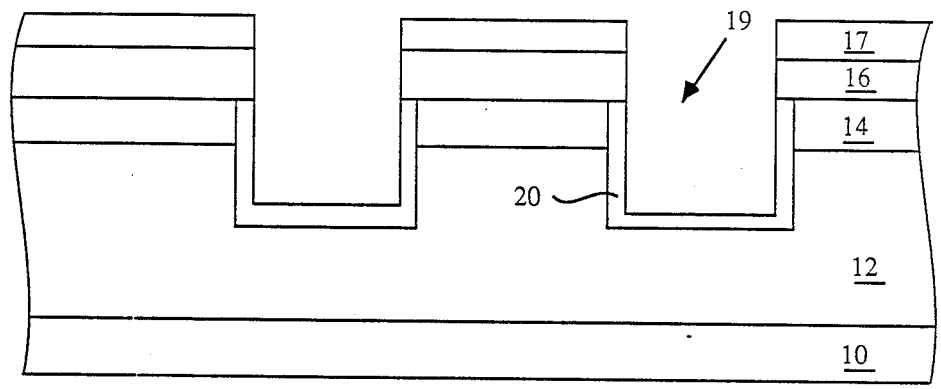

Referring to FIG. 2c, a SiO$_2$ layer 20 is then thermally grown on the walls and the bottom of trench 19, e.g. to a thickness of about 50 nm to 500 nm. As described in greater detail below, SiO$_2$ layer 20 separates a portion of N− region 12 from the subsequently formed polysilicon. As described in detail below, layer 20 is also used to ensure that a subsequently formed P+ gate region within N− region 12 is formed only at the bottom of trench 19. This ensures that the resulting transistor exhibits high gain and a high gatesource breakdown voltage. Of importance, the resulting transistor also exhibits symmetrical electrical characteristics, i.e. if the transistor is operated in the inverse mode, with substrate 10 serving as the source, the transistor electrical characteristics are similar to the device characteristics when N+ region 14 serves as the source.

The wafer is then subjected to a directional etching process, e.g. a vertical reactive ion etching process, a plasma etching process, or other anisotropic etching process to remove the portion of SiO$_2$ layer 20 on the bottom of trench 19. However, the portion of SiO$_2$ layer 20 formed on the vertical walls of trench 19 remains substantially intact at the conclusion of this step. Of importance, Si$_3$N$_4$ layer 17 serves as a mask for protecting SiO$_2$ layer 16 during this step.

Figure 2D:
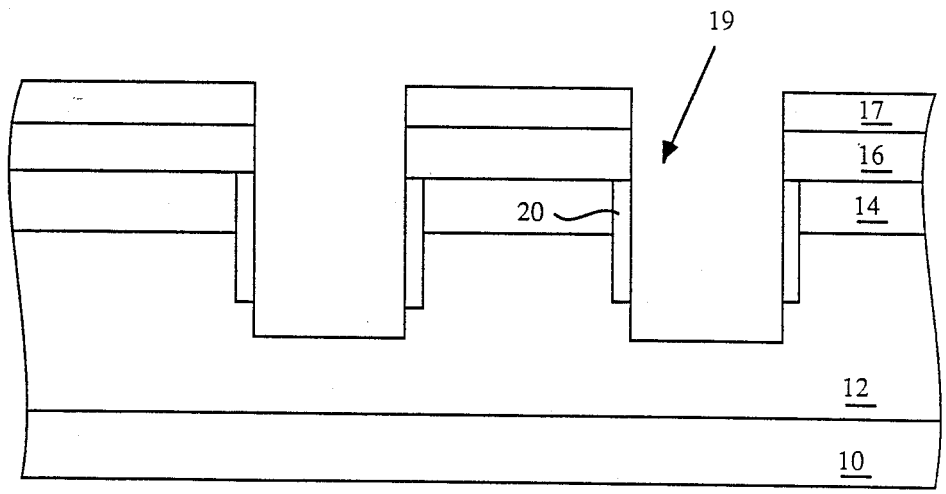

Referring to FIG. 2d, the wafer is then subjected to another etching process to extend trench 19 deeper into N− region 12. In one embodiment, N− region 12 is extended by a distance of 0.5 to 5 $\mu$m. Of importance, this etching step must be carefully timed to ensure that trench 19 extends to the proper depth. After this step, the bottom of trench 19 is about 0.5 to 5 $\mu$m from N+ region 10.

Figure 2E:
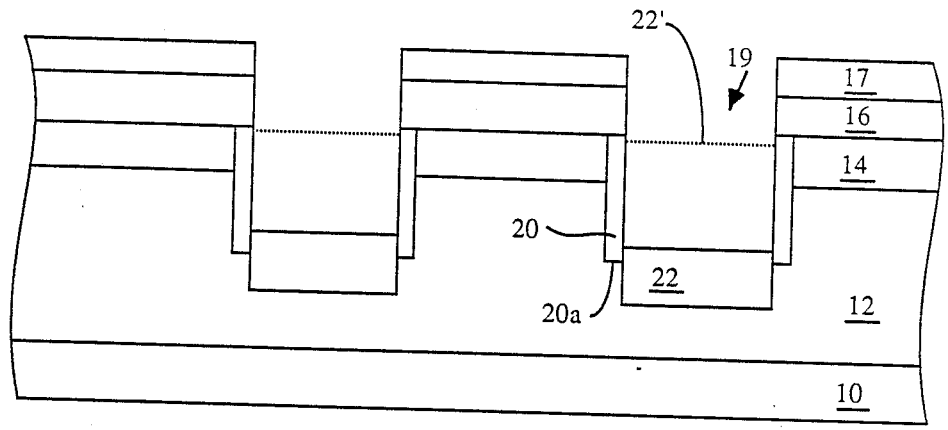

P+ polysilicon 22 is deposited on the wafer, e.g. by chemical vapor deposition. The wafer is then subjected to a planarization process to remove portions of P+ doped polysilicon 22 so that only a portion of polysilicon 22 at the bottom of trench 19 remains. The resulting structure is illustrated in FIG. 2e. As can be seen, at the conclusion of this step, the upper surface of polysilicon 22 extends above a lower edge 20a of SiO$_2$ sidewall 20, but below the lower surface of N+ source region 14. Because polysilicon 22 does not extend above the lower surface of N+ source region 14, the capacitance between region 14 and polysilicon 22 is minimized.

In one embodiment, the upper surface of polysilicon 22 is 0.2 to 3 $\mu$m, below the bottom of N+ region 14. In an alternate embodiment, the upper surface of polysilicon 22 is 0.2 to 4 $\mu$m below the interface between layer 16 and region 14. (The upper surface of polysilicon 22 is this alternate embodiment, is drawn in phantom as line 22'.) In yet another embodiment, the upper surface of polysilicon 22 is approximately coplanar with the top surface of region 14.

In one embodiment, a metal layer is deposited on polysilicon 22 to reduce the transistor gate resistance. This is typically accomplished using a selective metal deposition technique in which the metal is deposited on the polysilicon but not elsewhere on the wafer. Selective metal deposition is discussed, for example, by Sachdev et al. in "CVD Tungsten and Tungsten Silicide for VLSI Applications", published at pages 306 to 310 of Semiconductor International in May, 1985, incorporated herein by reference.

In another embodiment, gate resistance is reduced by forming a silicide layer at the surface of polysilicon 22, e.g. using a technique such as described by C. Y. Ting in "Silicide For Contacts and Interconnects", published at page 110 of the International Electron Devices Meeting, 1984, incorporated herein by reference.

Figure 2F:
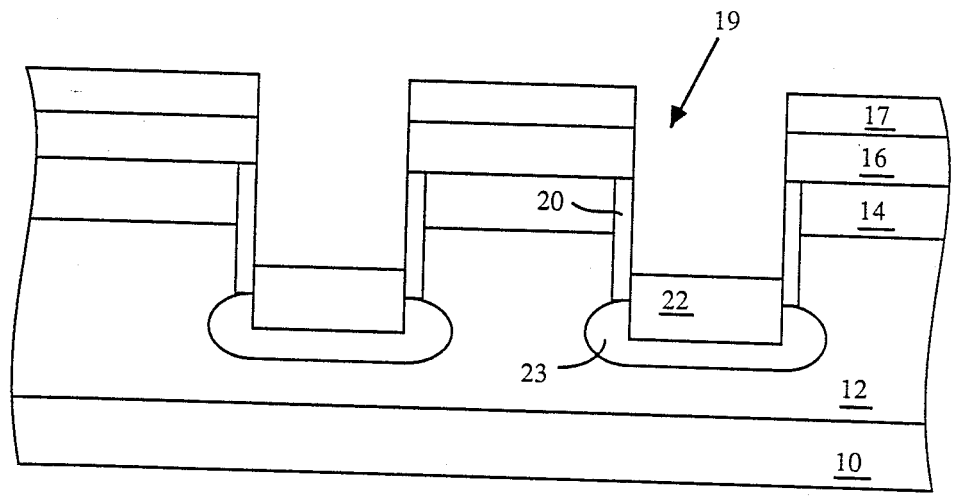

Impurities are then diffused out of P+ polysilicon 22, e.g., by heating the wafer, thereby forming a P region 23 (FIG. 2f). During operation of the resulting transistor, the size of the depletion region between P region 23 and N− layer 12 is modulated by applying a gate voltage to polysilicon 22 (and thus to P region 23), thereby controlling the voltage across the PN junction between P region 23 and N− layer 12. By controlling the size of the depletion region, the size of the conductive channel between N+ source region 14 and drain 10 is controlled and thus the amount of current flowing between N+ source 14 and N+ drain 10 is controlled.

Figure 2G:
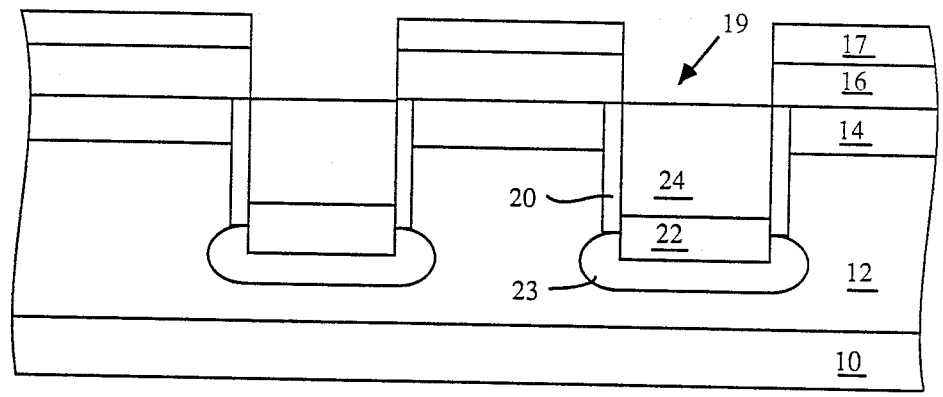

Referring to FIG. 2g, a low temperature oxide (LTO) layer 24 is then formed on the wafer. As used herein, LTO is an SiO$_2$ layer formed at a relatively low temperature, e.g. less than about 6000° C. and typically about 400° C., typically by chemical vapor deposition. The wafer is then subjected to another blanket dry etching process to remove the portion of LTO 24 on the surface of the wafer, except for the portion of LTO 24 within trench 19. Of importance, the etching is timed so that the upper surface of LTO 24 in trench 19 is coplanar with the surface of N+ source 14, thereby ensuring that the resulting transistor has a planar top surface. Si$_3$N$_4$ layer 17 serves as a mask to protect SiO$_2$ layer 16 during this process step.

Figure 2H:
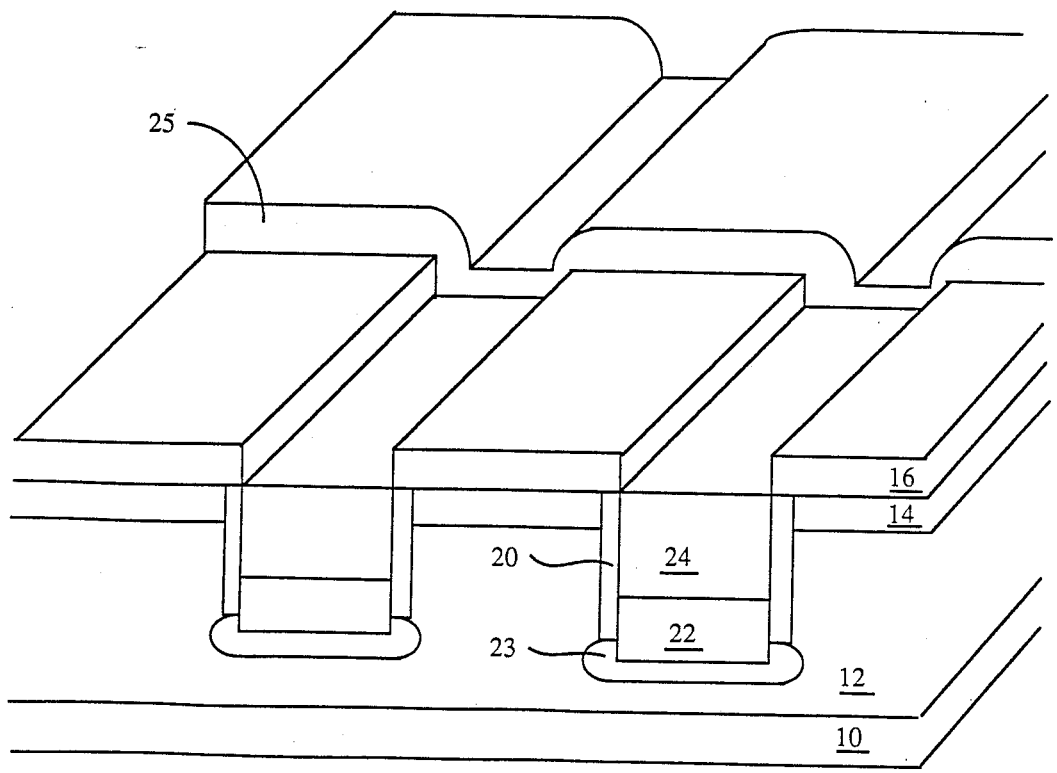

Referring to FIG. 2h, Si$_3$N$_4$ layer 17 is then removed, e.g., by placing the wafer in a phosphoric acid etching solution. (FIG. 2h illustrates the to-be-formed transistor along the cross-section of FIGS. 2a to 2g, along with a portion of the wafer surface adjacent thereto.) The wafer is then removed from the etching solution and covered with a photoresist layer 25. Photoresist layer 25 is then patterned as illustrated in FIG. 2h, thereby exposing a portion of the wafer where source region 14 is to be contacted. The exposed portion of the wafer is subjected to an etching process to remove the exposed portions of SiO₂ layer 16, e.g. by placing the wafer in an HF solution. Of importance, because of the thickness of LTO 24, only a negligible part of the exposed portion of LTO 24 is removed during this step. Photoresist layer 25 is then removed.

Figure 2I:
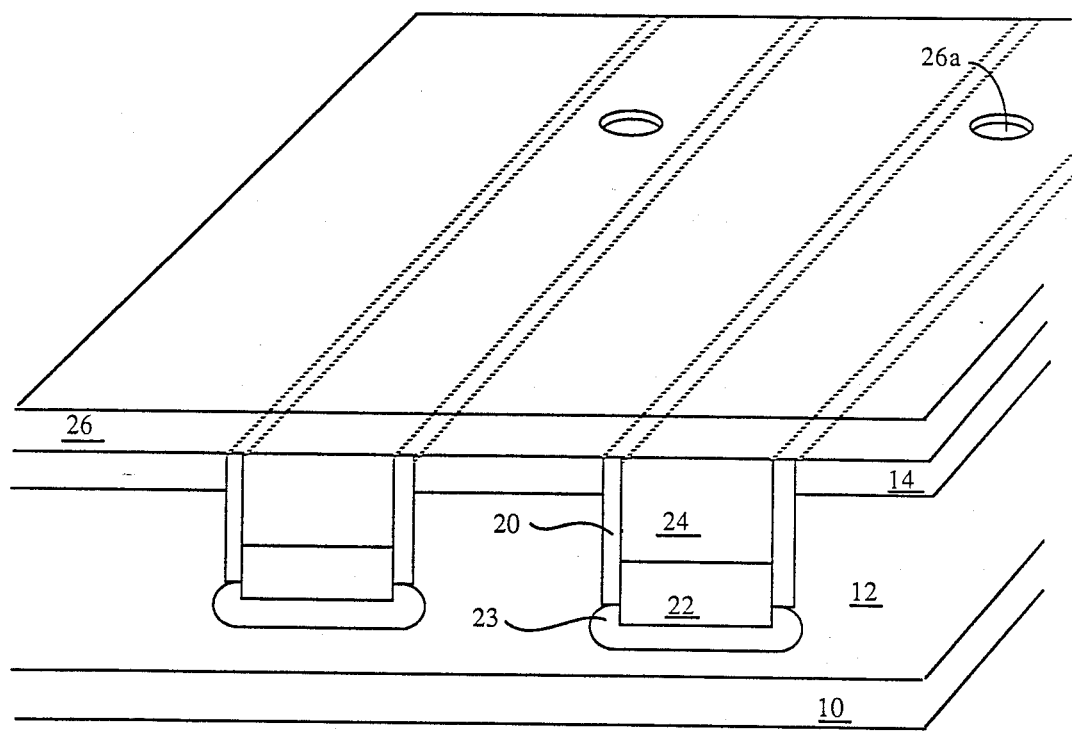

Referring to FIG. 2i, a photomask 26 is then applied to the wafer and patterned to form a window region 26a to expose a portion of SiO₂ layer 24 where polysilicon 22 is to be electrically contacted. The exposed portion of LTO layer 24 is then etched using either a dry etchant or an HF solution, thereby forming a contact hole in LTO layer 24. To facilitate formation of the contact hole, in one embodiment, the portion of trench 19 where the contact hole is formed is wider than the portion of trench 19 elsewhere on the wafer. Photomask 26 is then removed.

Figure 2J:
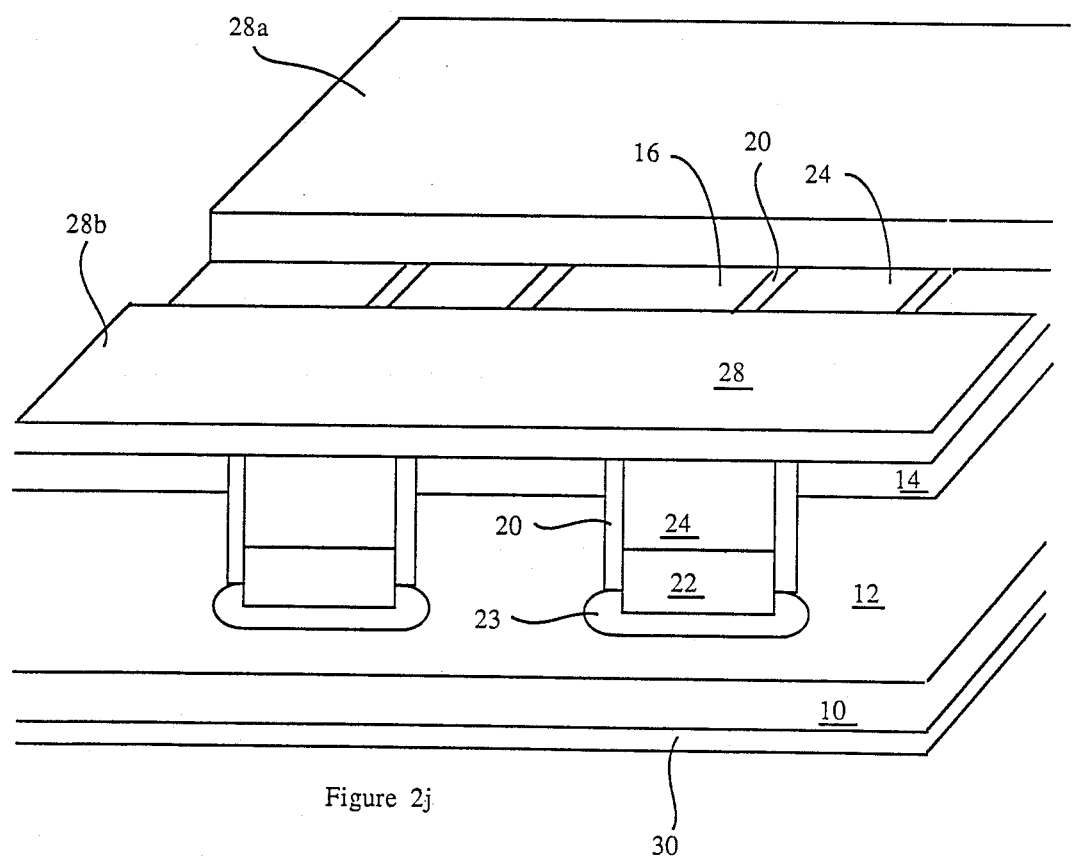

The top surface of the wafer is then covered with a metal layer 28 (e.g., aluminum or an alloy of aluminum) which is then patterned to form gate contact 28a and source contact 28b (FIG. 2j). Drain contact metallization 30 is then formed on the bottom side of the wafer. In one embodiment, metallization 28 and 30 are deposited by sputtering or evaporation.

The above process provides an N channel JFET. However, those skilled in the art will appreciate that a P channel JFET can be obtained by reversing the conductivity types of the various regions described above.

Figure 3:
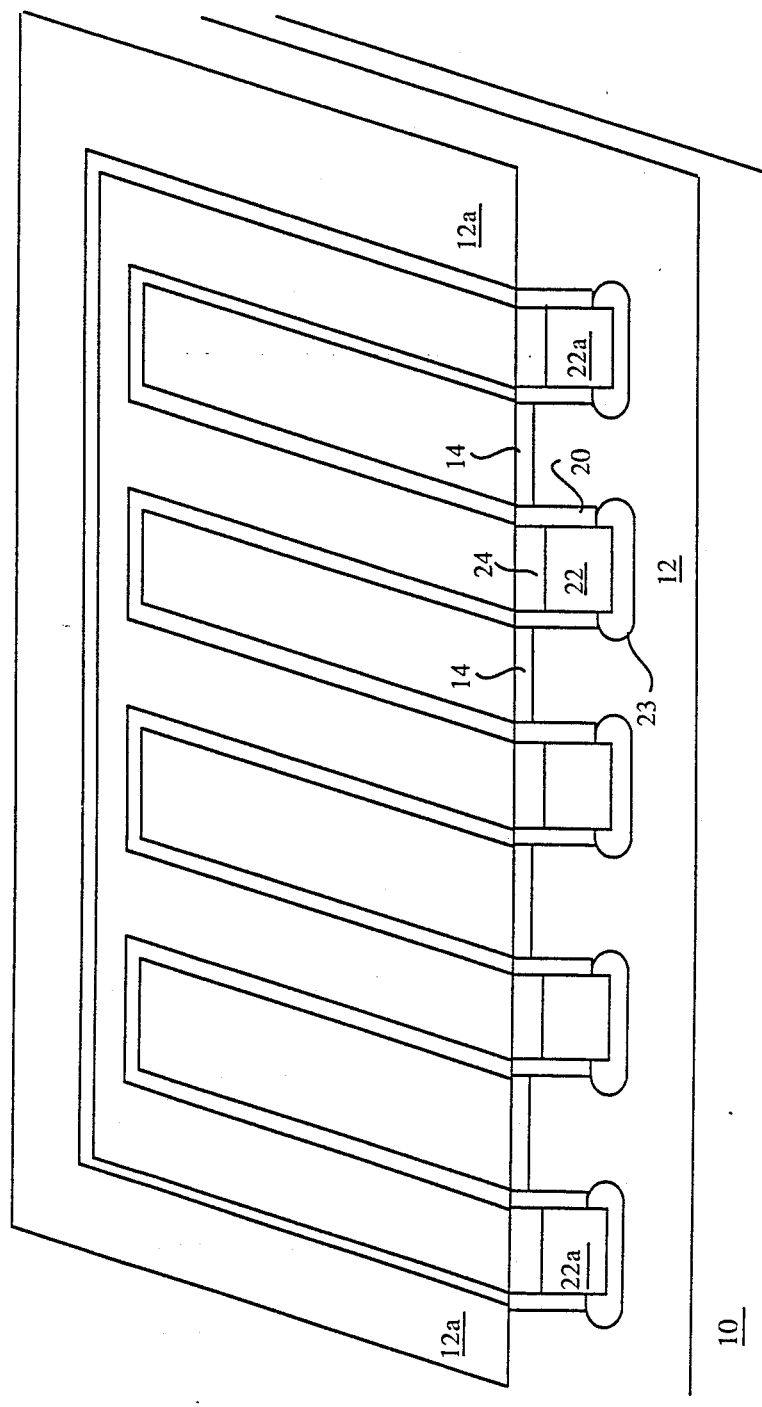
FIG. 3 illustrates a cross section and part of the top surface of a transistor constructed in accordance with the first embodiment.

As mentioned above, the transistor of FIGS. 2a to 2j typically includes a large number of cells or regions similar to those illustrated in the above referenced drawings. FIG. 3 illustrates a larger portion of a cross section and top surface of a transistor constructed in accordance with my invention. (FIG. 3 does not show SiO₂ layer 16, contact metallization or a contact hole in LTO layer 24 to simplify the illustration. Also, a transistor constructed in accordance with our invention typically includes more trenches than are shown in FIG. 3.) As can be seen, polysilicon 22a (part of the transistor gate structure) laterally surrounds the transistor, and a portion 12a of N− region 12 laterally surrounds polysilicon 22a. At the conclusion of the manufacturing process, portion 12a of N+ region 12 is covered with a remaining portion of SiO₂ layer 16. (As mentioned above, portions of SiO₂ layer 16 remain over parts of the wafer, but are not illustrated to simplify the illustration.) N+ source region 14 is typically formed so as to not extend outside the area encompassed by polysilicon 22a. The lateral extent of region 14 is typically confined using conventional masking steps during formation of region 14. In other embodiments, region 14 does extend outside the area encompassed by polysilicon 22a.

Figure 4:
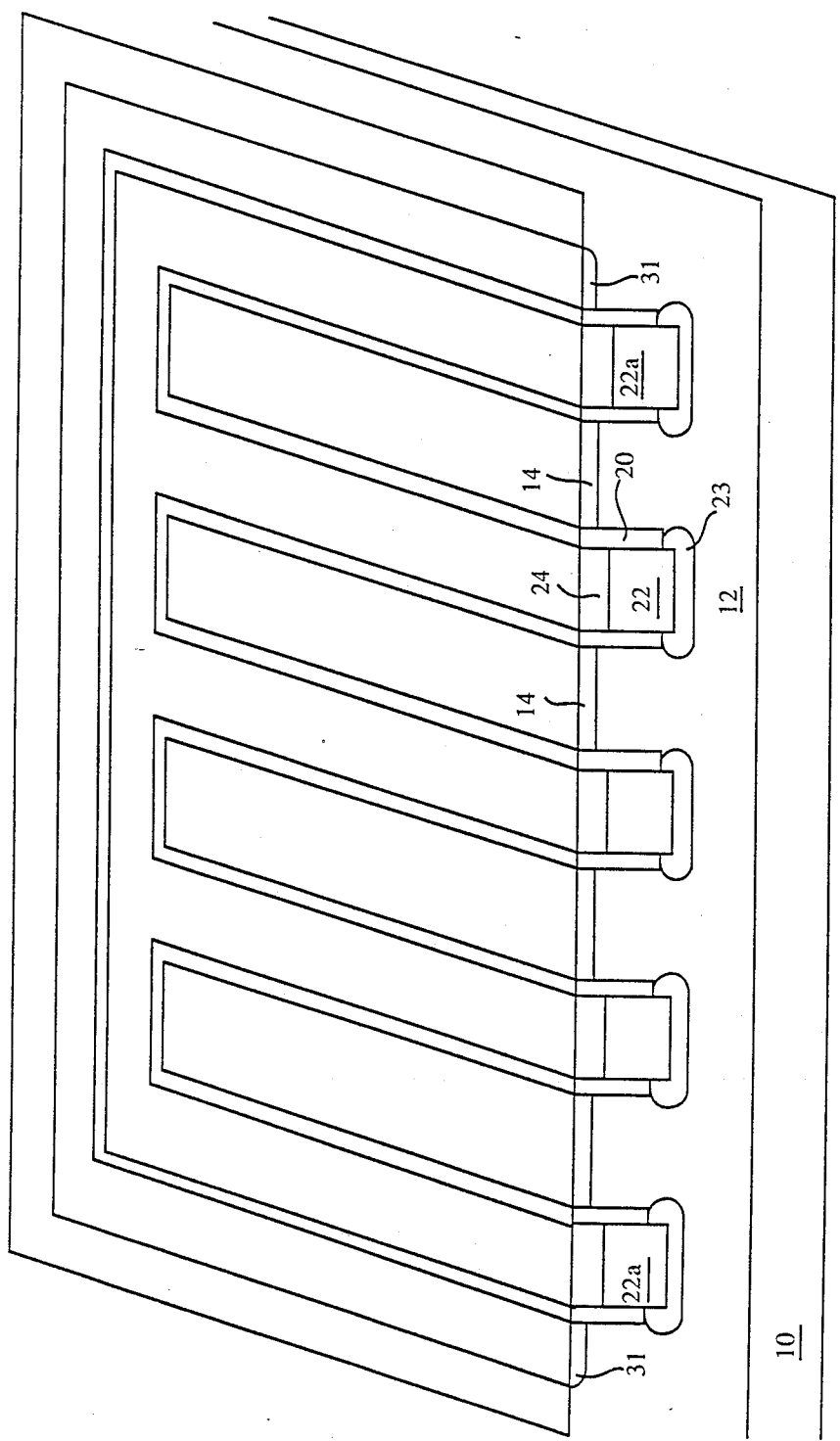
FIGS. 4 and 5 illustrate a cross section and part of the top surface of a transistor constructed in accordance with second and third embodiments of our invention.

FIG. 4 illustrates another embodiment of our invention, similar to the embodiment of FIG. 3, except a P+ region 31 laterally surrounds polysilicon 22a. P+ region 31 is typically formed by diffusion or implantation prior to forming SiO₂ layer 16, and is electrically connected to source 14.

Figure 5:
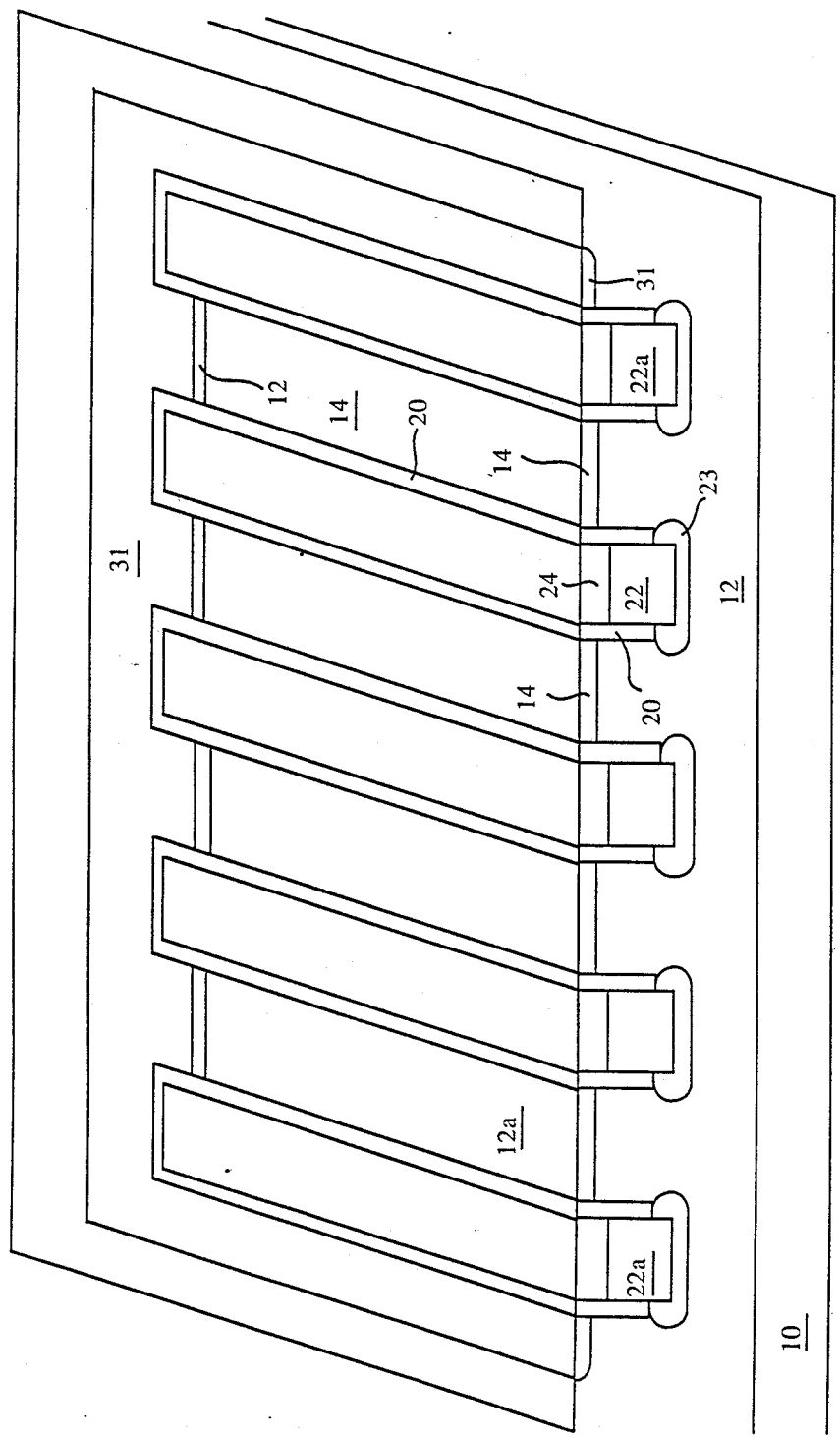

FIG. 5 illustrates yet another embodiment of my invention in which the transistor is laterally surrounded by P+ region 31, which is shorted to the transistor source regions. In the embodiment of FIG. 5, the transistor is not completely surrounded by polysilicon 22a.

Figure 6A:
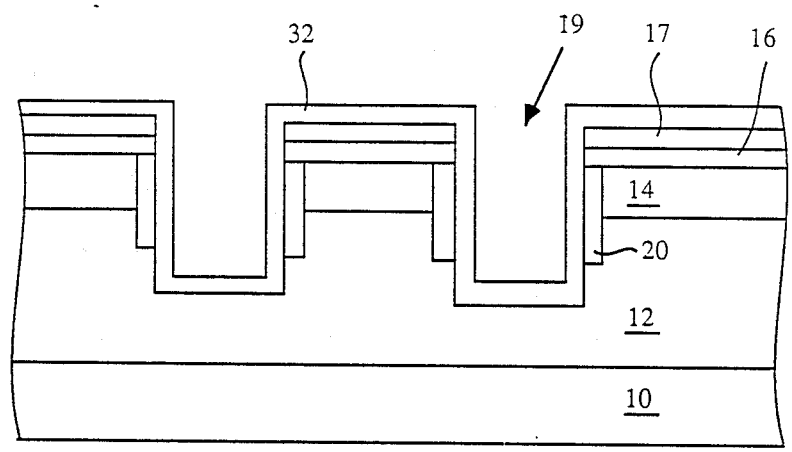
FIGS. 6a to 6e illustrate in cross section a transistor during a manufacturing process in accordance with a fourth embodiment of the invention.
Figure 6B:
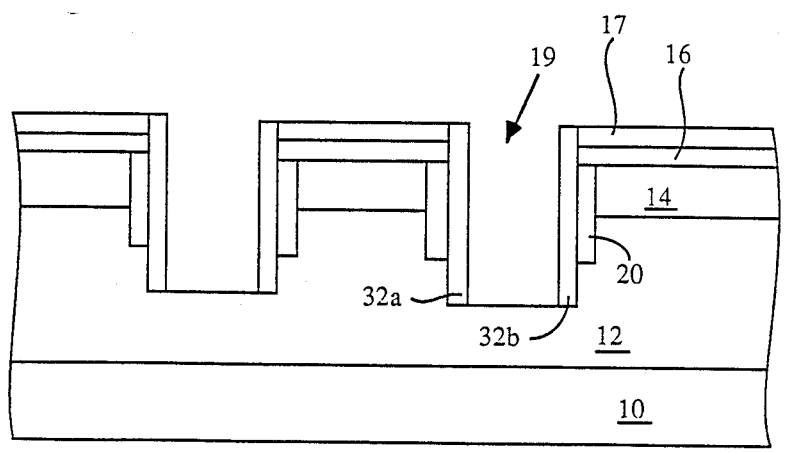
Figure 6C:
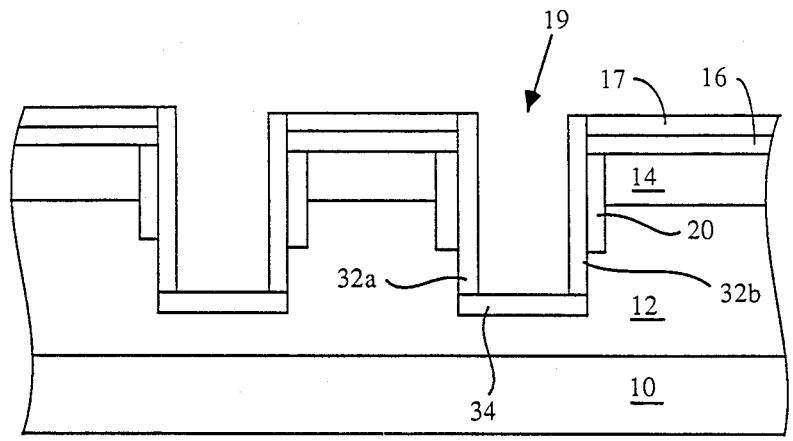

In an alternative embodiment of our invention, a silicon dioxide layer is formed at the bottom of the trench underneath polysilicon 22 to prevent impurities from diffusing downward from polysilicon 22. A process for forming this structure is illustrated in FIG. 6a to 6e. Referring to FIG. 6a, after etching trench 19, and thereby obtaining the structure illustrated in FIG. 2d, a Si₃N₄ layer 32 is formed on the surface of the wafer by chemical vapor deposition, e.g. to a thickness of 50 to 400 nm. Si₃N₄ layer 32 is then subjected to a vertical etching process, thereby leaving Si₃N₄ sidewalls 32a and 32b along the vertical walls of trench 19 (FIG. 6b). The portion of Si₃N₄ layer 32 on the bottom of trench 19 is removed during this step, thus exposing a portion of N− silicon layer 12. (Of importance, this etching step is carefully timed to avoid removal of Si₃N₄ layer 17). Thereafter, the portion of N− silicon layer 12 exposed during the etching of Si₃N₄ layer 32 is thermally oxidized to form an SiO₂ layer 34 (FIG. 6c). Layer 34 is typically 0.2 to 1 μm thick.

Figure 6D:
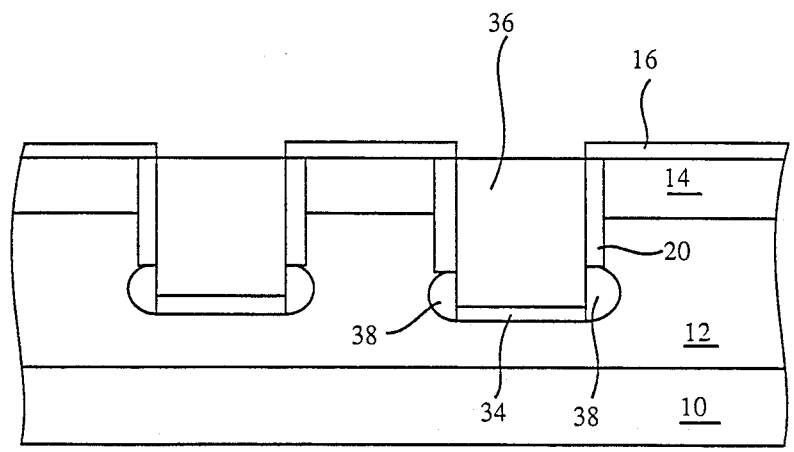

Si₃N₄ layer 17 and the remaining portion of Si₃N₄ layer 32 are removed with a blanket etching process, e.g., by placing the wafer in a phosphoric acid etching solution (FIG. 6d). The wafer is then covered with P+ polysilicon 36 and polysilicon 36 is etched using a vertical etching process so that only the polysilicon within trench 19 remains. Of importance, the top surface of remaining polysilicon 36 is approximately coplanar with the surface of N− source region 14, so that the resulting transistor surface is planar.

P type impurities are then diffused from P+ polysilicon 36 into surrounding N− region 12, thereby forming P regions 38, e.g. by heating the wafer. (During operation of the resulting transistor, the size of the depletion region between P regions 38 and N− region 12 is modulated by application of an appropriate voltage to P+ polysilicon 36.) Of importance, SiO₂ layer 34 prevents downward diffusion of P type impurities from P+ polysilicon 36, and thus prevents a PN junction from forming along the bottom of polysilicon 36. Similarly, in the embodiment of FIGS. 6a to 6e, sidewall SiO₂ layer 20 prevents impurities from diffusing into N+ region 14 from polysilicon 36 and forming a P type region which would form a highly capacitive junction with N+ source region 14.

Figure 6E:
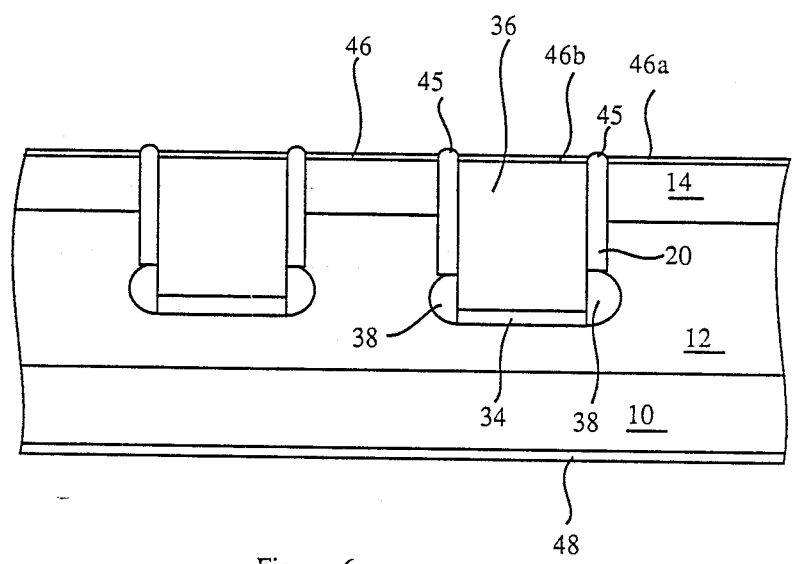
Figure 7:
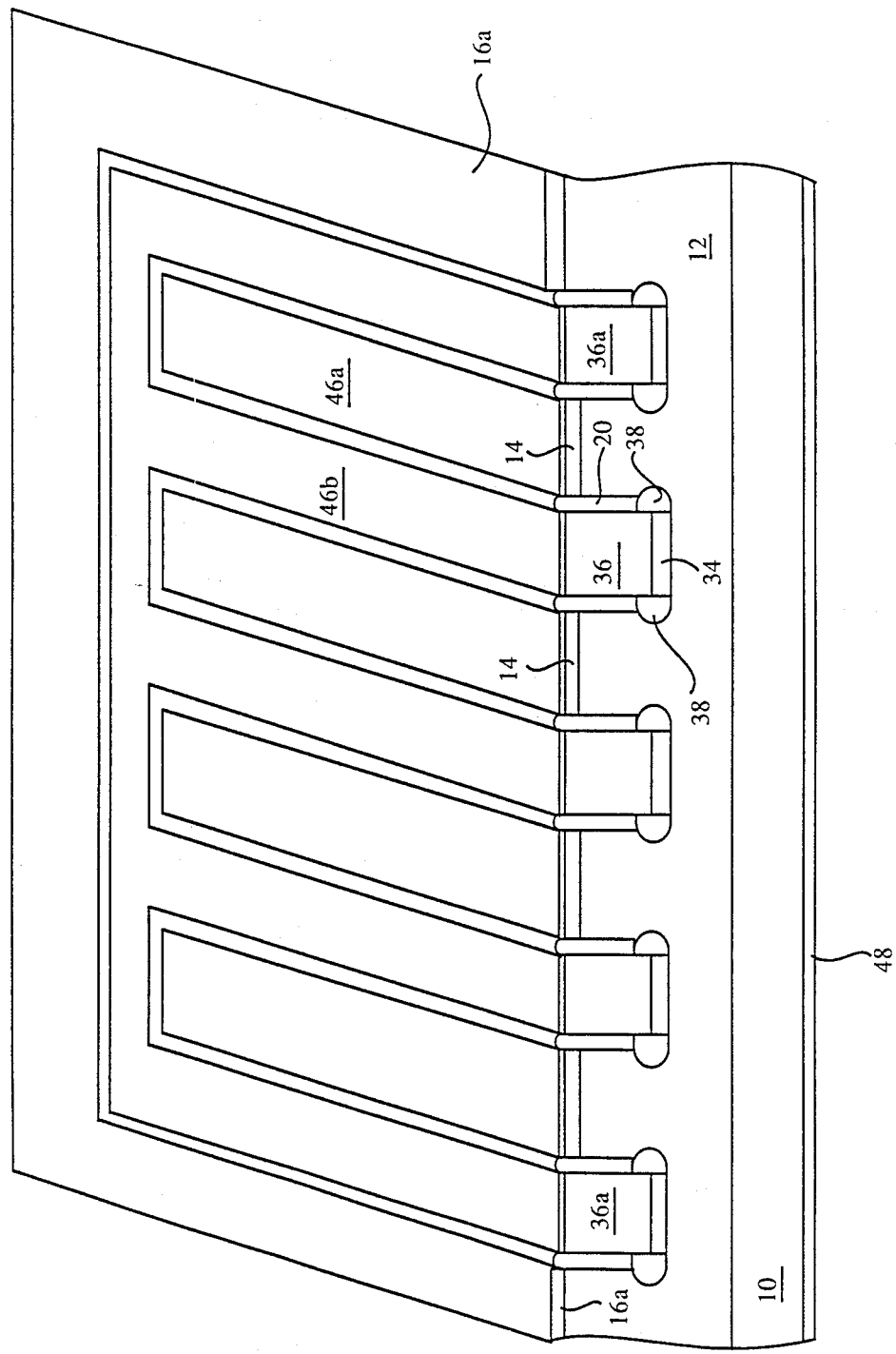
FIG. 7 illustrates a cross section and part of the top surface of the transistor of FIGS. 6a to 6e.

Referring to FIG. 6e, the wafer is then subjected to an etching step to remove SiO₂ layer 16 (e.g. by placing the wafer in an HF solution). As discussed below, a portion 16a (FIG. 7) of SiO₂ layer 16 in the periphery of the wafer is protected by a photomask during this step.

A silicon etching step (e.g. a wet etching process or a plasma or reactive ion etching process) is then performed to remove about 0.3 to 2 μm of exposed silicon and polysilicon. A conventional silicon etching process is used during this step. Of importance, this etching process is adjusted so that SiO₂ humps 45 (remaining portions of SiO₂ sidewall layer 20) are not removed.

Metallization 46 (e.g. aluminum) is then deposited, e.g. by evaporation, on the surface of the wafer to electrically contact N+ source 14 and polysilicon 36. Metallization 46 is about 0.3 to 1.5 μm thick. Of importance, SiO₂ humps 45, which extend above the surface of the wafer, prevent portion 46a of metallization 46 (portion 46a contacts source 14) from electrically contacting portion 46b (portion 46b contacts polysilicon 36) and thus prevents a gate-source short.

The reason portions 46a and 46b of metallization 46 do not contact each other is due to the fact that humps 45 of SiO₂ layer 20 have a contour which inhibits metallization step coverage when metallization is formed by evaporation. Thus, it is not necessary to use a photomask to define the gate and source electrical contacts in the vicinity of the transistor. In another embodiment, metallization 46 is deposited using the above-mentioned selective deposition process, so that metallization is only formed over exposed silicon.

Drain contact metallization 48 is then deposited on the bottom of the wafer, e.g. by sputtering.

Metallization formed on source regions 14 and gate 22 is contacted by a bonding wire in a conventional manner. The widths of the portions of source 14 and polysilicon 22 where the bonding wire is to be attached can be enhanced to facilitate bonding.

In the embodiment of FIGS. 6a to 6f, a portion 36a of polysilicon 36 (FIG. 7) laterally surrounds the transistor, and a remaining portion 16a of SiO2 layer 16 laterally surrounds polysilicon 36a. Metallization is typically formed over SiO2 portion 16a during the above-described evaporation process. Portions of the metallization on SiO2 portion 16a can optionally be removed by selective etching while the metallization in the active areas of the transistor are protected with a photomask.

Figure 8:
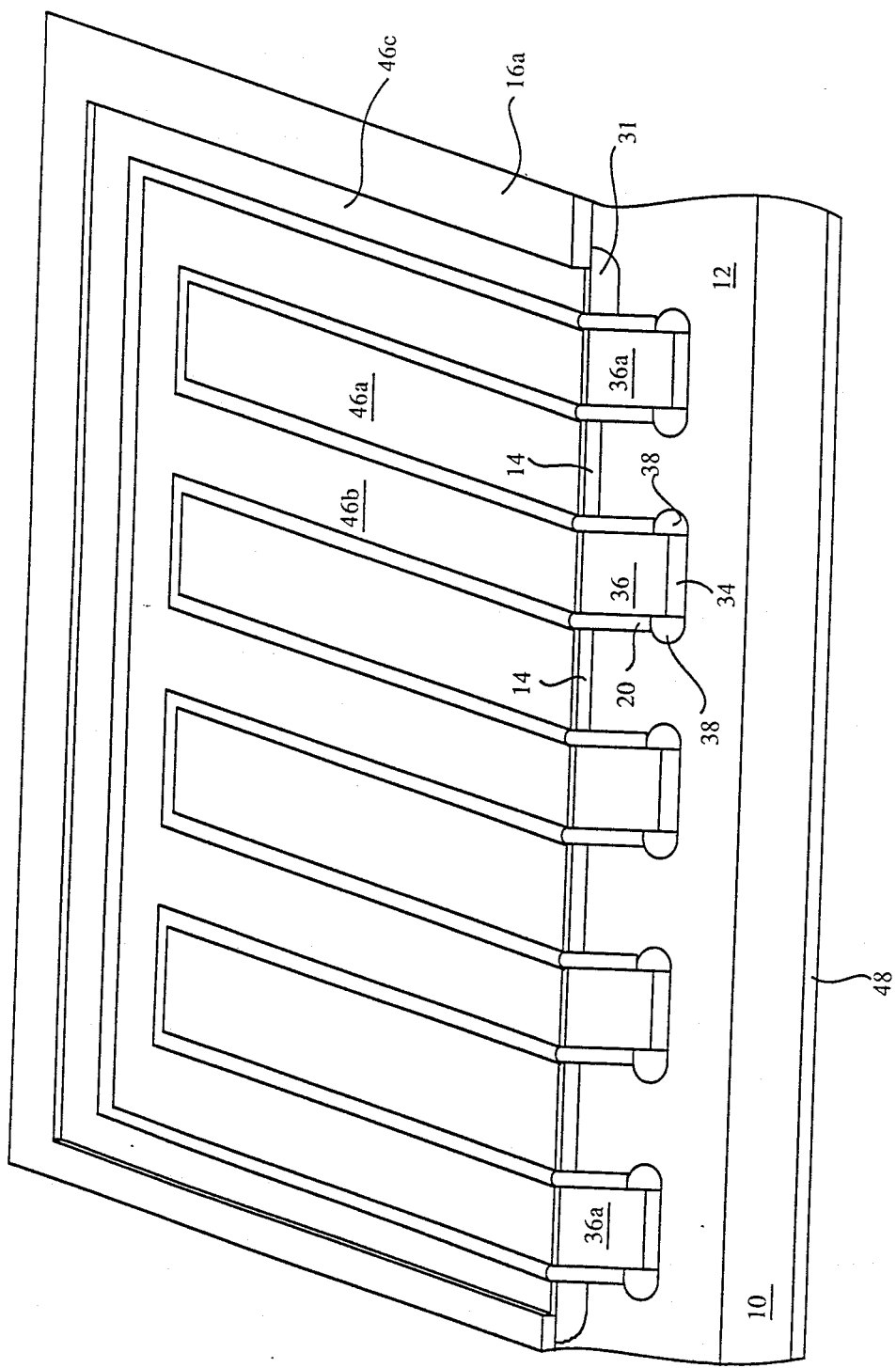
FIGS. 8 and 9 illustrate a cross section and part of the top surface of a transistor in accordance with fifth and sixth embodiments of our invention.
Figure 9:
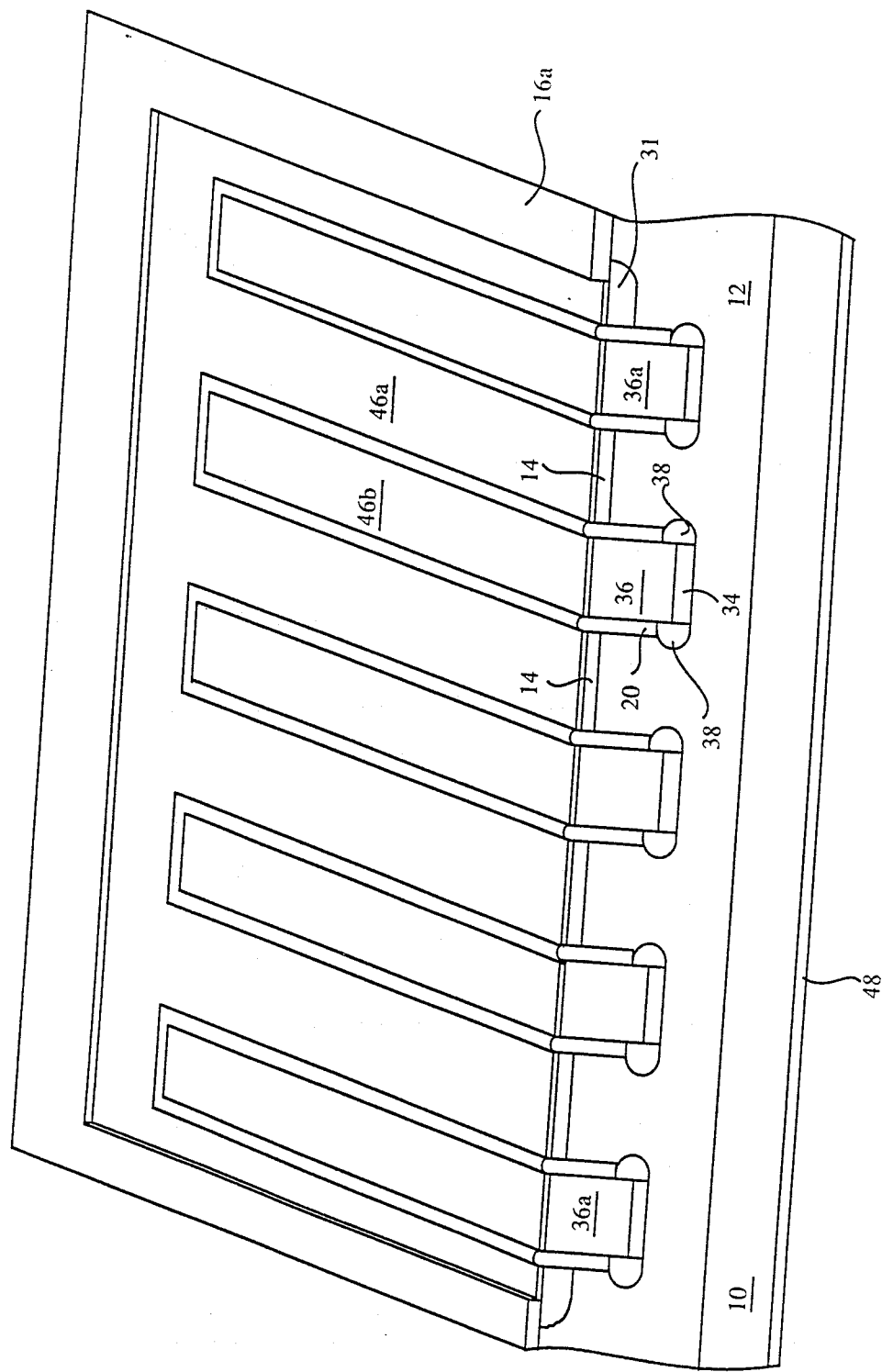

FIG. 8 illustrates another embodiment in which P+ region 31 laterally surrounds polysilicon 36a. P+ region 31 is contacted by portion 46c of metallization 46. Metallization 46c is contacted by a bonding wire in the same manner as polysilicon 36 and N+ source 14. P+ region 31 is typically connected via the bonding wire, to source 14.

FIG. 8 illustrates yet another embodiment in which polysilicon 36a does not surround the transistor, but P+ region 31 does. P+ region 31 is electrically contacted by metallization 46a.

While the invention has been described with regard to specific embodiments, those skilled in the art will appreciate that changes can be made in form and detail without departing from the spirit and scope of the invention. For example, in another embodiment, polysilicon 36 extends to the top of trench 19 but SiO2 layer 34 at the bottom of trench 19 is not formed. In yet another embodiment, SiO2 layer 34 is formed, but polysilicon 36 does not extend to the top of trench 19. Accordingly, all such changes come within the present invention.

We claim:

1. A method for manufacturing a transistor comprising the steps of:
    providing a structure comprising a first region of semiconductor material of a first conductivity type, a second region of semiconductor material of said first conductivity type formed on said first region, a third region of semiconductor material of said first conductivity type formed on said second region, the dopant concentration of said second region being less than the dopant concentration of said first and third regions;
    forming a plurality of trenches, each trench extending through said third region and a portion of said second region;
    forming insulating layers on at least a portion of the walls of said trenches, said insulating layers extending from the top of said trenches along at least a portion of the walls of said trenches;
    depositing doped semiconductor material in said trenches, said doped semiconductor material having a second conductivity type opposite said first conductivity type, wherein a portion of said insulating layers extends above the surface of said third region and the surface of said doped semiconductor material;
    diffusing impurities from said doped semiconductor material into the portion of said second region adjacent said doped semiconductor material, thereby forming a plurality of regions of said second conductivity type within said second region; and
    depositing conductive material on the surface of said third region and said doped semiconductor material, said portion of said insulating layers having a contour preventing step coverage of said conductive material over said portion of said insulating layers.

2. The method of claim 1 wherein said doped semiconductor material comprises polysilicon.

3. The method of claim 1 further comprising the step of forming an insulating layer on the bottom of said trenches prior to forming said doped semiconductor material to prevent downward diffusion of impurities from said doped semiconductor material into said second region.

4. The method of claim 1 wherein said step of depositing doped semiconductor material comprises the step of forming said doped semiconductor material on the surface of said structure and in said trenches and removing the portion of said doped semiconductor material on said surface of said structure and a portion of said doped semiconductor material in said trenches, thereby leaving a portion of said doped semiconductor material at the bottom of said trenches, said method further comprising the step of filling an upper portion of said trenches with a layer of material so that the resulting transistor has a planar top surface.

5. The method of claim 1 wherein said step of forming said trenches comprises the step of etching said trenches to a first depth, forming said insulating layers, and then extending said trenches to a second depth.

6. The method of claim 1 wherein said doped semiconductor material extends to the top of said trenches so that the resulting transistor is substantially planar.

7. The method of claim 1 wherein said conductive material is a metal.

8. Method of claim 1 further comprising the step of electrically contacting said doped semiconductor material in said trenches, said first region, and said third region, such that application of a gate voltage to said doped semiconductor material modulates current permitted to flow between said first and third regions.

9. A method for manufacturing a transistor comprising the steps of:
    providing a structure comprising a region of semiconductor material having a top surface and a trench extending through said top surface and at least a portion of said region of semiconductor material, said trench having walls;
    forming a layer of insulating material on at least a portion of the walls of said trench;
    depositing semiconductor material into said trench; and
    depositing conductive material on the device resulting from the previous steps, a first portion of said conductive material electrically contacting said region of semiconductor material, a second portion of said conductive material contacting said semiconductor material within said trench, said layer of insulating material separating said region of semiconductor material from said semiconductor material within said trench, said conductive material being deposited so that step coverage of said conductive material over said insulating material is prevented and so that said first portion does not electrically contact said second portion.

10. The method of claim 9 wherein a portion of said insulating material extends higher than the top surface of said region of semiconductor material and higher than the top surface of said semiconductor material in said trench, said portion of insulating material separating said first and second portions of said conductive material.

11. The method of claim 9 wherein said step of depositing semiconductor material comprises the step of substantially filling said trench with said semiconductor material.

12. Method of claim 9 further comprising the step of subjecting said region of semiconductor material and said semiconductor material in said trench to an etching process prior to said step of depositing conductive material so that a portion of said insulating material extends higher than the top surface of said semiconductor material in said trench and said region of semiconductor material.

13. A method for manufacturing a transistor comprising the steps of:
provinding a region of semiconductor material of a first conductivity type having a top surface and a plurality of trenches formed therein, each trench extending through said top surface and a portion of said region of semiconductor material;
forming insulating layers on at least a portion of the walls of said trenches;
depositing doped semiconductor material in said trenches, said doped semiconductor material having a second conductivity type opposite said first conductivity type, a portion of said insulating layers extending past the top surface of said doped semiconductor material and said region of semiconductor material;
diffusing impurities from said doped semiconductor material into the portion of said region of semiconductor material adjacent said doped semiconductor material, thereby forming a plurality of regions of said second conductivity type within said region of semiconductor material, said plurality of regions serving as the gate of said transistor; and
depositing conductive material on the surface of said region of semiconductor material and said doped semiconductor material, said portion of said insulating layers having a contour preventing step coverage of said conductive material over said portion of said insulating layers.

* * * * *